US009953694B2

(12) United States Patent
Querbach et al.

(10) Patent No.: US 9,953,694 B2
(45) Date of Patent: Apr. 24, 2018

(54) MEMORY CONTROLLER-CONTROLLED REFRESH ABORT

(71) Applicant: Intel Corporation, Santa Clara, CA (US)

(72) Inventors: Bruce Querbach, Hillsboro, OR (US); Kuljit S. Bains, Olympia, WA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 15/174,946

(22) Filed: Jun. 6, 2016

(65) Prior Publication Data

US 2017/0352406 A1 Dec. 7, 2017

(51) Int. Cl.
 *G11C 7/00* (2006.01)
 *G11C 11/406* (2006.01)
 *G06F 3/06* (2006.01)
 *G11C 14/00* (2006.01)

(52) U.S. Cl.
 CPC ...... *G11C 11/40618* (2013.01); *G06F 3/0604* (2013.01); *G06F 3/0632* (2013.01); *G06F 3/0659* (2013.01); *G06F 3/0679* (2013.01); *G11C 14/0009* (2013.01)

(58) Field of Classification Search
 USPC ............. 365/222, 230.03; 711/100, 106
 See application file for complete search history.

(56) References Cited

U.S. PATENT DOCUMENTS

| 6,778,458 | B2 | 8/2004 | Tsern et al. |
| 6,779,076 | B1* | 8/2004 | Shirley ............... G06F 12/0893 105/154 |
| 6,961,278 | B2* | 11/2005 | Jeong ................ G11C 7/1072 365/222 |
| 7,136,978 | B2 | 11/2006 | Miura et al. |
| 7,613,064 | B1 | 11/2009 | Wagner et al. |
| 8,122,188 | B2 | 2/2012 | Sohn et al. |
| 9,053,812 | B2* | 6/2015 | Bains ................ G11C 11/40615 |
| 2003/0198115 | A1 | 10/2003 | Schaefer et al. |

(Continued)

OTHER PUBLICATIONS

International Search Report and Written Opinion for PCT Patent Application No. PCT/US 2017/031620, dated Aug. 7, 2017, 15 pages.

(Continued)

*Primary Examiner* — Vu Le
(74) *Attorney, Agent, or Firm* — Compass IP Law PC

(57) ABSTRACT

A memory subsystem enables a refresh abort command. A memory controller can issue an abort for an in-process refresh command sent to a memory device. The refresh abort enables the memory controller to more precisely control the timing of operations executed by memory devices in the case where a refresh command causes refresh of multiple rows of memory. The memory controller can issue a refresh command during active operation of the memory device, which is active operation refresh as opposed to self-refresh when the memory device controls refreshing. The memory controller can then issue a refresh abort during the refresh, and prior to completion of the refresh. The memory controller thus has deterministic control over both the start of refresh as well as when the memory device can be made available for access.

29 Claims, 8 Drawing Sheets

(56) References Cited

U.S. PATENT DOCUMENTS

| | | |
|---|---|---|
| 2005/0007848 A1 | 1/2005 | Shirley |
| 2005/0105357 A1 | 5/2005 | Oh |
| 2007/0070768 A1 | 3/2007 | Kwak et al. |
| 2009/0249169 A1* | 10/2009 | Bains .................... G06F 11/106 |
| | | 714/766 |
| 2010/0080075 A1 | 4/2010 | Kunce et al. |
| 2011/0131371 A1 | 6/2011 | Sun et al. |
| 2012/0079182 A1 | 3/2012 | Bains |
| 2012/0079183 A1 | 3/2012 | Bains |
| 2012/0331220 A1 | 12/2012 | Bains |

OTHER PUBLICATIONS

Prashant Nair, et al., A Case for Refresh Pausing in DRAM Memory Systems, 2013, IEEE 978-1-4673-5587-2.

* cited by examiner

MODE REGISTER (MRx) 400

| ADDRESS | OPERATING MODE | DESCRIPTION |
|---|---|---|
| Ay | REFRESH ABORT | 0=DISABLE REFRESH ABORT<br>1=ENABLE REFRESH ABORT - RECEIPT OF ABORT DURING REFRESH TRIGGERS EXIT ON NEXT ROW |

COMMAND ENCODING 500

| | CMD | CKE | CMD SIGNALING | BG[...] | BA[...] | ADDR |
|---|---|---|---|---|---|---|
| 502 | REF | H | REF CMD | X | X | X |
| 504 | REFpb | H | REF CMD | BG | BA | X |
| 506 | ACT | H | ACT CMD | X | X | X |
| 508 | ACTpb | H | ACT CMD | BG | BA | X |
| 510 | ABORT | H | ABORT CMD | X/BG | X/BA | X |

MEMORY CONTROLLER-CONTROLLED REFRESH ABORT

FIELD

The descriptions are generally related to memory management, and more particular descriptions are related to refresh operations of volatile memory devices.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

Volatile memory resources find widespread usage in current computing platforms, whether for servers, desktop or laptop computers, mobile devices, and consumer and business electronics. DRAM (dynamic random access memory) devices are the most common types of memory devices in use. Volatile memory needs to be refreshed to maintain data in a valid state. However, as memory capacity continues to increase, the time needed to perform a refresh operation (i.e., tRFC) increases. During refresh the memory resources being refreshed are unavailable for read and write accesses. Thus, the increase in refresh time decreases the usable bandwidth in the memory subsystem.

DRAM refresh consumes a large percentage of overall bandwidth. For example, with a 4 Gb DDR4 (dual data rate version 4) die, a refresh command is sent every 7.8 microseconds (us), and each refresh command takes approximately 260 nanoseconds (ns) to complete execution. Thus, refresh consumes approximately 260 ns/7.8 us=5.38% of bandwidth. With the increase to 16 Gb memory devices the number of rows refreshed in response to each command is expected to double to approximately 550 ns for refresh to complete execution, and the time between refreshes is expected to be cut in half to 3.9 us, which results in refresh taking up approximately 550 ns/3.9 us=14.1% of total bandwidth.

A controller initiates a refresh to the DRAM, which ends up locking up the entire rank for the duration of the refresh execution (e.g., 260 ns or 550 ns in accordance with the examples above). Any requests to a DRAM in refresh traditionally have to wait until completion of the refresh. As the refresh execution time increases with increasing memory densities, the probabilities of transactions becoming stalled due to ongoing refreshes increases. Longer refresh times also impact isochronous bandwidth requirements.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, AND/OR characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4 is a block diagram of an embodiment of a mode register that enables refresh abort in a memory device.

FIG. 5 is a block diagram of an embodiment of command encoding for a refresh abort command.

Figure 1:
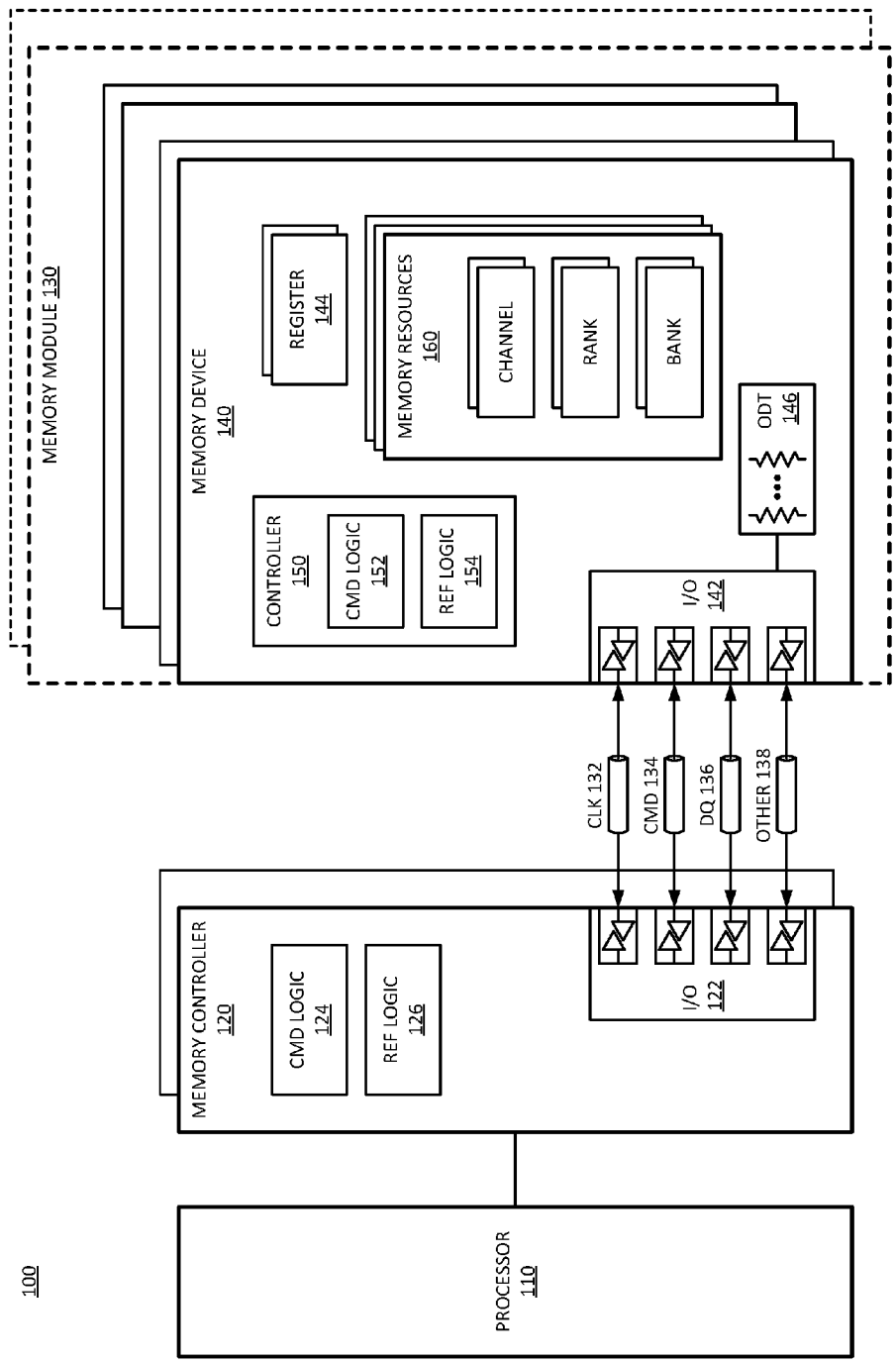
FIG. 1 is a block diagram of an embodiment of a system in which memory controller controlled refresh can be aborted.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a refresh abort command provides more control to a memory controller over refresh timing and operation. The refresh abort enables a memory controller to issue an active refresh operation to put a memory into refresh, and then issue a refresh abort to take the memory back out of refresh to enable another access to the memory prior to completion of the refresh operation. Thus, a memory controller can issue an abort for an in-process refresh command being executed by a memory device. The refresh abort enables the memory controller to more precisely control the timing of operations executed by memory devices in the case where a refresh command causes refresh of multiple rows of memory. The memory controller can issue a refresh command during active operation of the memory device, which is active operation refresh as opposed to self-refresh when the memory device controls refreshing. The memory controller can then issue a refresh abort during the refresh, and prior to completion of the refresh. The memory controller thus has deterministic control over both the start of refresh as well as when the memory device is again available for access.

Referring to the examples of DDR4 (dual data rate version 4) DRAM (dynamic random access memory) devices mentioned previously, a DDR4 DRAM is required to refresh all rows every 64 milliseconds (ms). For a DRAM including 8K rows, the time between refreshes is (64 ms/8192=7.8 us). Thus, a DRAM has a time between refreshes (tREFI) of 7.8 us to refresh a single row for each refresh operation. Higher density memory devices can include 32K rows or more, and with shrinking device dimensions the time to refresh all rows may be reduced to 32 ms. Thus, the DRAM refreshes multiple rows per refresh command. Commonly a memory device refreshes 4, 8, or 16 rows per external refresh command. Thus, in response to a single refresh command by the memory controller, the internal logic of the memory device will generate multiple internal refresh operations to complete execution of the received refresh command.

The increase in the number of internal operations to refresh multiple rows per command has increased the refresh time or time to execute a refresh (tRFC) from a row access time (e.g., tRC) to a period much longer than the row access time. As mentioned previously, tRFC can grow to 550 ns or more with increasing memory densities. Thus, tRFC can be a long period of unavailability for the memory controller to wait to access a memory address. The increase in tRFC impacts the performance of the memory subsystem. As described herein the memory controller can abort a refresh, and cause the memory device to become available sooner than the tRFC that it would otherwise be unavailable.

The memory controller can issue an abort to abort any ongoing refreshes initiated by the controller. It will be understood that there is a difference between an external refresh to be executed by the memory device in active mode, and a self refresh to be executed by the memory device in low power mode. In low power mode, a memory device can execute a self refresh, where the memory device itself controls the refreshing, including the timing of the refresh. The memory device does not apply an external or synchronized clock in self refresh. While abort from self refresh is known, it relies on the fact that the memory controller cannot know where the memory device is in refresh, and therefore cannot deterministically access the memory device out of self refresh without the abort command. Thus, a self refresh abort brings the memory device out of low power mode and provides determinism to the memory controller as to when the memory device can be accessed (after a period of tXS or self refresh abort timing or fast exit from self refresh).

In contrast to the self refresh abort mechanism, active refresh is executed by a memory device in an active state. Thus, the timing of access to the memory device is already deterministic. The memory device is already active, and the memory controller can determine the timing of availability of the memory device. However, there are potential scenarios where a memory controller would like to control the execution of the refresh. Traditionally, once a memory controller provides a refresh command (i.e., an active refresh) to the memory device, it has to wait until the refresh command completes before being able to access the memory resources, including allowing the refresh of all rows to be refreshed per command (e.g., 4, 8, 16, or other number N of rows). While a memory controller could cause an abort of self refresh, such an abort will involve a synchronization of the clocks once the memory device exits self refresh, and there are limits to the types of access that can be made to the memory device for at least the first few cycles after exit due to the change from low power to active mode. A refresh abort of an active command can be followed immediately with an access command (e.g., any type of read or write or a combination). Such abort of active refresh provides control to the memory controller over the timing of refresh operations, and the execution of refresh and memory access.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "DRAM" or "DRAM device" can apply to any memory device that allows random access, whether volatile or nonvolatile. The memory device or DRAM can refer to the die itself, to a packaged memory product that includes one or more dies, or both.

FIG. 1 is a block diagram of an embodiment of a system in which memory controller controlled refresh can be aborted. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. System 100 can be implemented as an SOC (system on a chip), or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAM devices in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus or a memory bus or both, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 130, I/O 142 can include interface hardware of the memory module in addition to interface hardware on the memory device itself. Other memory controllers 120 will include separate interfaces to other memory devices 140.

The system bus can be implemented as multiple signal lines coupling memory controller 120 to memory devices 140. The system bus includes at least clock (CLK) 132, command/address (CMD) and write data (DQ) 134, read DQ 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands and address information) and the signal lines for write and read DQ can be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

It will be understood that the system bus includes a command and write data bus 134 configured to operate at a bandwidth. In one embodiment, the command and write signal lines can include unidirectional lines for write and command data from the host to memory, and read DQ 136 can include unidirectional lines for read data from the memory to the host. In one embodiment, the data bus can includes bidirectional lines for read data and for write/command data. Based on design of system 100, or implementation if a design supports multiple implementations, the data bus can have more or less bandwidth per memory device 140. For example, the data bus can support memory devices that have either a ×32 interface, a ×16 interface, a ×8 interface, or other interface. The convention "×W," where W is a binary integer refers to an interface size of memory device 140, which represents a number of signal lines to exchange data with memory controller 120. The interface size of the memory devices is a controlling factor on how many memory devices can be used concurrently per channel in system 100 or coupled in parallel to the same signal lines.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., ×16 or ×8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "mode," where command information can trigger different operations within memory device 140 based on the mode. Additionally or in the alternative, different modes can also trigger different operation from address information or other signal lines depending on the mode. Settings of register 144 can indicate configuration for I/O settings (e.g., timing, termination or ODT (on-die termination), driver configuration, or other I/O settings).

In one embodiment, memory device 140 includes ODT 146 as part of the interface hardware associated with I/O 142. ODT 146 can be configured as mentioned above, and provide settings for impedance to be applied to the interface to specified signal lines. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading. ODT 146 can be applied to specific signal lines of I/O interface 142, 122, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 of memory device 140 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can also ensure compliance with standards or specifications by access scheduling and control.

In one embodiment, memory controller 120 includes refresh (REF) logic 126. Refresh logic 126 can be used where memory devices 140 are volatile and need to be refreshed to maintain a deterministic state. In one embodiment, refresh logic 126 indicates a location for refresh, and a type of refresh to perform. Refresh logic 126 can trigger self-refresh within memory device 140, and issue external refreshes by sending refresh commands to trigger the execution of a refresh operation. For example, in one embodiment, system 100 supports all bank refreshes as well as per bank refreshes, or other all bank and per bank commands. All bank commands cause an operation of a selected bank within all memory devices 140 coupled in parallel. Per bank commands cause the operation of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command. For self-refresh, refresh logic 154 controls the timing and execution of refresh in response to entry into a low power mode and self-refresh based on a command from memory controller 120.

In one embodiment, refresh logic 126 is configured to issue a refresh abort of an active refresh command. The active refresh command refers to an external refresh command controlled by memory controller 120, which causes memory device 140 to perform a refresh in active mode, and not in a low power or self-refresh mode. In response to issuance of a refresh abort command by memory controller 120, refresh logic 154 of memory device 140 can terminate a refresh command prior to completion of the refresh. For N rows to be refreshed in response to the command, memory device 140 can forego refresh of N–X rows, where N is the number of rows to be refreshed on each refresh command to complete execution of the refresh command, and X is a number of rows not executed due to an abort. X can be any number of rows from 1 to N–1. Abort of the refresh can enable memory controller 120 to issue an access command (e.g., read or write) that memory device 140 will execute without waiting for completion of the refresh.

Figure 2:
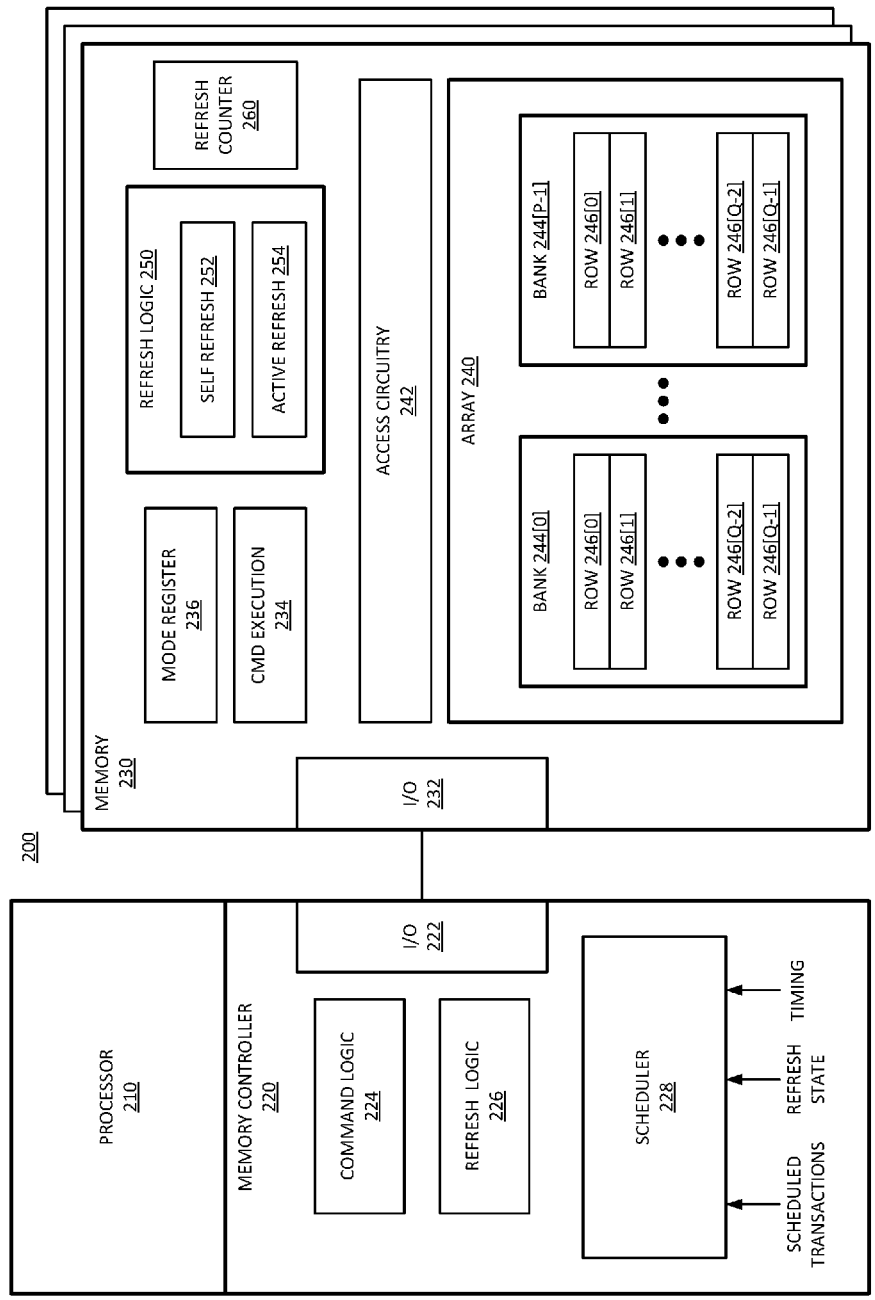
FIG. 2 is a block diagram of an embodiment of a system that performs refresh abort for active refreshes.

FIG. 2 is a block diagram of an embodiment of a system that performs refresh abort for active refreshes. System 200 illustrates one example of a system in accordance with system 100 of FIG. 1. System 200 includes processor 210, which can be or include one or multiple processors whose execution generates requests for data or code or both stored in memory 230. Memory 230 represents volatile storage resources that require refreshing to maintain a valid state. Memory controller 220 generates memory access commands for specific addresses or storage location of memory 230 in response to memory requests created by execution of processor 210. Memory controller 220 includes mapping information to map data address information in processor 210 with physical locations in memory 230. In one embodiment, memory controller 220 is an integrated memory controller (e.g., iMC). In one embodiment, memory controller 220 is a standalone controller device or standalone circuit. In one embodiment, processor 210 and memory controller 220 are part of a common SOC.

Memory controller 220 includes I/O 222, which represents interface hardware and logic, such as what is described above with respect to I/O 122 of system 100. I/O 232 of memory 230 has corresponding signal lines to exchange data and commands with memory controller 220. Command logic 224 represents logic to enable memory controller 220 to issue commands to memory 230. The commands can include commands to set a mode of memory 230. The commands can include commands to access one or more memory locations of memory 230. In one embodiment, memory 230 includes multiple separate memory devices, and I/O 222 can interface the multiple devices in parallel.

Refresh logic 226 represents logic within memory controller 220 to issue refresh commands, which can include refresh abort commands. It will be understood that refresh logic 226 is set out separately from command logic 224 for purposes of illustration. In one embodiment, all refresh commands are issued as memory access commands by command logic 224. Thus, refresh logic 226 can be considered part of command logic 224. Schedule 228 represent logic within memory controller 220 to schedule memory access commands and refresh commands. It will be understood that a primary function of memory controller 220 is to schedule the commands sent to memory 230.

Scheduler 228 can be part of primary execution logic for memory controller 220. In one embodiment, memory controller 220 includes a processor circuit to execute firmware logic that makes determinations about what commands to issue when, and to execute on the determinations by sending the commands. In one embodiment, scheduler 228 makes determinations about what commands to send when, including what refresh commands to send, based at least in part on scheduled transactions, which can be transactions in a queue waiting for transmission to memory 230, refresh state of memory 230, which can include whether the device is currently in refresh, timing associated with how long currently executing or pending transactions are expected to take to execute in memory 230, or other information, or a combination.

In one embodiment, scheduler 228 determines based on timing that memory 230 is expected to be in refresh for a given amount of time, for example. Scheduler 228 may determine based on the amount of time the memory is expected to be in refresh, plus how long it has been since the current rows were last refreshed, that a refresh can be aborted in favor of a memory access command to reduce the performance impact of having to wait for the memory access to occur. Scheduler 228 may determine that scheduled transactions will write to memory locations that would otherwise soon need to be refreshed, and determine to abort refreshes for the memory location in favor of simply writing new valid data to the memory locations rather than refreshing the values currently in the memory locations. Based on scheduling by scheduler 228, memory controller 220 can issue commands, refreshes, and refresh aborts to memory 230.

Thus, scheduler 228 can determine that access to one or more memory locations has priority over a refresh operation, and abort the refresh to permit the access. In one embodiment, scheduler 228 determines that a requested memory access, such as a read operation, to a bank will obviate the need to refresh the N rows. In such a case, the scheduler can schedule an abort of the refresh to be sent by refresh logic 226 or command logic 224, and then not scheduler a subsequent refresh for the N rows. In one embodiment in such a case, memory 230 is configured in such scenarios to increment refresh counter 260 in response to the subsequent access after the abort, to align the counter to the proper next row for a subsequent refresh command.

Memory 230 includes command execution logic 234, which represents logic that enables memory 230 to decode commands within the memory device. Based on decoding the command, command execution logic 234 can generate internal commands to perform the operations required by the commands. The internal commands can include setting logic values of switches, gates, or other hardware resources, or a combination, to perform the desired operations. Memory 230 is illustrated with access circuitry 242, which represents hardware logic such as column access logic including drivers and buffers, and row access logic including drivers to select specific bits of specific rows 246 of one or more banks 244 of memory array 240. Memory array 240 represents the hardware storage locations. Column logic can issue column address strobes (CAS) and row logic can issue row address strobes (RAS) in response to address decoding of address information in a received command. In one embodiment, access circuitry 242 includes multiplexers, logic gates, or other circuitry, or a combination of circuits, to decode the address information.

In one embodiment, memory 230 includes mode register 236 or equivalent to store configuration information that at least partially controls the operation of memory 230. Settings within mode register 236 control the mode or state of operation of memory 230, and can control how received commands are decoded for execution by memory 230. In one embodiment, mode register 236 includes one or more bits or fields to control a refresh abort mode. When refresh abort is enabled, memory 230 can receive and execute a refresh abort command to terminate an executing refresh command. In one embodiment, if refresh abort is not enabled, a received abort command will not cause termination of the refresh.

Memory 230 includes refresh logic 250, which can be considered part of command execution logic 234 in one embodiment. Refresh logic 250 can includes self-refresh logic 252 to enable memory 230 to execute self-refresh by internally controlling refresh and refreshing timing. Self-refresh logic 252 can include application of an internal oscillator or timer (not explicitly shown) to control the timing of refresh. Active refresh logic 254 represents logic to respond to external refresh commands controlled by controller 220. Active refresh logic 254 executes refreshes based on one or more timing signals received from memory controller 220, which maintains memory 230 synchronized in active refresh.

In one embodiment, memory 230 includes refresh counter 260 to keep track of what rows to refresh. In system 200, either a self-refresh command or an active refresh command results in refresh of multiple rows 246. In self-refresh, self-refresh logic 252 generates N internal refresh commands based on internal timing. In active refresh, refresh logic 226 of memory controller 220 issues a refresh command, which active refresh logic 254 executes by generating N internal refresh commands based on external timing. In one embodiment, refresh counter 260 increments (or alternatively could otherwise keep track of row address information) in response to completion of a refresh operation, or refresh of all N rows.

In one embodiment, memory 230 supports all bank refresh commands (e.g., REF) as well as per bank refresh commands (e.g., REFpb). For an all bank refresh command, all P banks 244 can execute refresh of N row 246 of their Q rows. For a per bank refresh command, memory controller 220 issues a refresh command that includes bank address information, and active refresh logic 254 causes the refresh of N of the Q rows of only the selected bank 244. In one embodiment, refresh abort commands can be per bank or all bank commands. For example, memory controller 220 can issue a refresh abort command without specifying bank address, and active refresh logic 254 will abort refresh in all banks 244 performing refresh. In a related example, memory controller 220 can issue a refresh abort command and specify bank address, and active refresh logic 254 will abort the refresh of a specified or selected bank.

In one embodiment, the refresh abort command includes an activate command (ACT). Thus, an activate command without bank address information can be identified as ACT, and operate to abort an active refresh. It will be understood that a refresh operation typically includes an activate operation. Such a refresh activate operation is generated by active refresh logic 254 in response to an external refresh command. In one embodiment, when memory 230 receives an external activate during execution of an external refresh, the memory device treats the activate as an abort command. Other abort commands are possible, and a specific command can be defined to abort refresh instead of using an ACT command. In one embodiment, memory 230 and memory controller 220 support an ACTpb command, which can be understood as a per bank refresh abort, which can be implemented as identical to an ACT command, but specifying bank address information.

One example of the operations for refresh abort can be identified as follows. In one embodiment, during initialization of memory 230, memory controller 220 sets a mode register setting (e.g., via a mode register set or MRS command) to enable "refresh abort" in memory 230. In one embodiment, during a refresh cycle time (e.g., tRFC) for memory 230, memory controller 220 issues an activate (e.g., ACT) or other refresh abort command to memory 230. Memory 230 receives the command and treats it as a trigger to abort the refresh prior to completion, or prior to the full refresh cycle time. In one embodiment, memory controller 220 issues the abort command without bank or row address information to cause an all bank abort. In one embodiment, memory controller 220 issues the abort command with bank address information to target the abort to a specific bank.

In one embodiment, active refresh logic 254 completes refresh of a row 246 currently being refreshed, but does not continue to refresh of a subsequent row. Typically there will be a delay period required to complete the refresh of the row and provide a guard band to ensure the memory resources are ready for access. Thus, in one embodiment, after an abort exit timing is complete, memory controller 220 issues an activate (ACT) command to open a page of memory. If ACT is used as the refresh abort command, the ACT command to open the page of memory will be a second ACT command. Thus, a first ACT command can trigger exit, and a subsequent ACT command will open a page to ready the memory for access.

In one embodiment, memory 230 does not increment refresh counter 260 when a refresh is aborted. Rows 246 that would have been refreshed had the refresh operation been allowed to continue to completion will be selected for refresh on a subsequent refresh command. Thus, in one embodiment, memory controller 220 must issue an extra refresh for every refresh aborted. It will be understood that such an abort does not pause the refresh, but terminates it. A paused refresh can be picked back up where it was interrupted. In one embodiment, an aborted refresh must be started over with a subsequent refresh command.

It will be understood that providing the ability to memory controller 220 to abort active refreshes can provide greater flexibility in scheduling at the memory controller. The refresh abort enables the memory controller to execute all refresh intelligence. It will be understood that in self-refresh the memory device is in control of the timing, but in active refresh the memory controller is responsible for the timing. Thus, active refresh abort enables the memory controller a tool to control the amount of time taken up by a refresh command, if there are reasons to shorten the amount of time taken by refresh. For example, memory controller 220 can determine that inability to access a bank to be refreshed would have a negative performance impact, and that refresh can be delayed for a period of time. Thus, even after issuance of the refresh command, the memory controller can then abort it to perform the access, and later issue a refresh command to refresh the rows for which refresh was aborted. Consider a case where a memory controller determines that access to one or more banks will include a write to areas to be refreshed. Instead of continuing with a refresh of all banks, the memory controller can abort the refresh, issue per bank refreshes to non-target banks, and issue memory access commands to target banks instead of refreshes. Such an example will be understood as one simple example of many potential uses of a refresh abort.

In all cases of active refresh abort, memory controller 220 is still responsible for the refresh timing and ensuring that all rows are timely refreshed. Thus, the memory controller will ensure that aborted refreshes do not violate the refresh interval, including not issuing a refresh abort when doing so would violate the refresh interval. The ability of memory controller 220 to issue refresh abort commands can help the memory controller manage power, bandwidth, performance, and latency parameters related to interfacing with memory 230.

It will be understood that while a mechanism has been proposed to suspend or pause a refresh command and later resume the refresh command, such a mechanism requires additional pins or command encodings, or both. In one embodiment, aborting a refresh as described herein enables memory controller 220 to abort a refresh with available commands and to restart refresh with no additional pins or command encodings. Furthermore, pausing refreshes can also be complicated when internal refresh operations are staggered (refer to FIG. 3 for more details). Internal refresh operations are typically staggered in current memory devices. The known refresh suspend mechanism assumes serial refreshes, where each internal operation completes prior to the next one beginning. However, serial refreshing would further extend tRFC. There is no known suggestion in the industry how pausing staggered refresh operations could work. Thus, there is no known technique to provide the capability provided by the refresh abort described herein.

Figure 3:
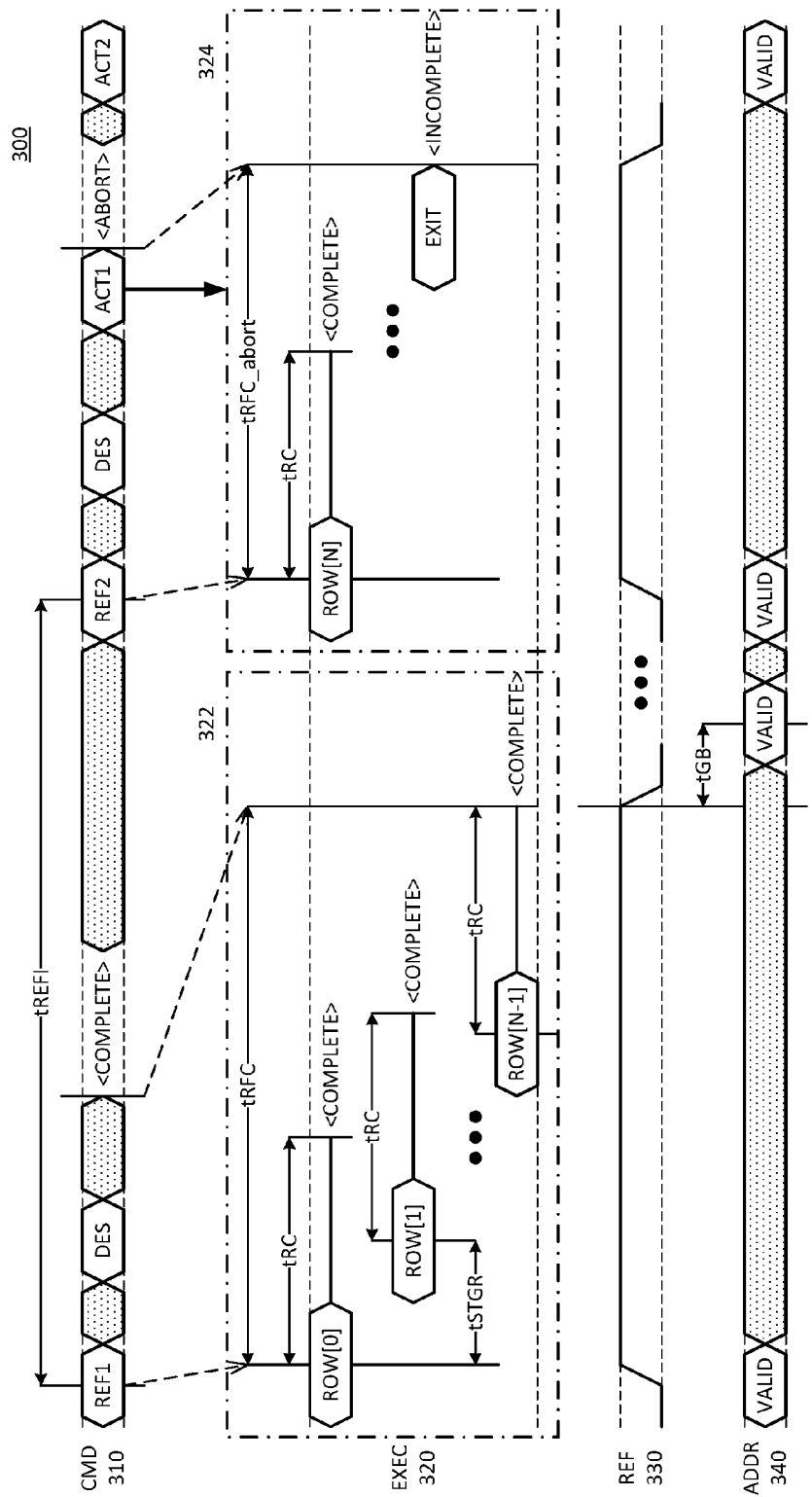
FIG. 3 is a timing diagram of an embodiment of aborting active refresh.

FIG. 3 is a timing diagram of an embodiment of aborting active refresh. Diagram 300 illustrate selected timing elements, and is not necessarily a complete representation of all signals or operations that occur. Furthermore, the illustrated blocks do not necessarily convey scale or amount of time. Rather, the diagram illustrates relative order of operations. Diagram 300 can illustrate refresh timing for a system in accordance with system 100 of FIG. 1 or system 200 of FIG. 2.

Diagram 300 illustrates command signal 310, which illustrates selected command signals issued by a memory controller and received at a memory device that interfaces with the memory controller. Command signal 310 is issued by the memory controller over a command signal line. Command signal 310 illustrates a first refresh command identified as "REF1." The first refresh command represents an external refresh command to cause the memory device to perform refresh in active mode. Typically there is at least some period of delay between the refresh command and a subsequent command, as illustrated by the shaded area. In one embodiment, the memory controller issues a deselect command (DES) subsequent to a refresh command. A deselect command is comparable to a no-operation command (NOP), but without requiring assertion of a chip select signal (CS, not shown). In one embodiment where a command follows the refresh command, a NOP could be used alternatively to a deselect command.

In response to REF1, in one embodiment, an active refresh is entered by the memory device for all banks corresponding to a next group of N rows to refresh if REF1 is an all bank refresh command, or for a specified bank if REF1 is a per bank refresh command, as illustrated by refresh signal 330. N is a number of rows dependent on the density of the memory device and the operational parameters of the memory device (such as how long rows can go between refreshes). It will be understood that refresh signal 330 is not necessarily a signal on a signal line, but represents a state of the memory device, and illustrates an availability of the refreshed resources. More specifically, address signal 340 represents an address signal line as part of the interface between the memory device and the memory controller. The address information of address signal 340 is valid up until the memory controller issues REF1. When in refresh, address signal 340 is not valid, as illustrated by the shaded area. Address signal 340 is not valid for the period of time for which refresh 330 is active (as illustrated by the logic '1' or the "high" signal), plus a guard band tGB, which could be no delay or a short delay between when refresh completes to when the memory resources are again available for memory access.

The execution of the refresh command occurs via internal operations within the memory device in response to the external command from the memory controller. In one embodiment, a controller within the memory device (different from the memory controller of the host) controls the execution of the internal operations to implement the commands received from the memory controller. Execution (EXEC) 320 represents the execution of the internal operations in response to the external refresh command. Execution 320 illustrates transaction 322 including operations performed in response to REF1.

As illustrated, the operations of transaction 322 take tRFC to complete. The operations commence in response to the REF1 command, and include N internal operations to perform refresh on N rows, as illustrated by the internal operations labeled by the row that will be refreshed. Row[0] represents the row number indicated by address information, such as by an internal refresh counter, without an address offset. In one embodiment, each refresh includes an internal activate (ACT) followed by precharge (PRE). Row[1] indicates the row address offset by an increment of 1, and so forth to Row[N−1]. The refresh of each row takes a row cycle time (e.g., tRC) to complete. As illustrated in diagram 300, the refresh of the N rows occurs in a staggered pattern, where Row[0] refresh starts, and some stagger time tSTGR (which could also be identified as tSTAG), later, Row[1] refresh starts. While not specifically shown, Row[2] refresh would start tSTGR after the start of Row[1], and so forth. It will be understood that the staggering refers to staggering the start of refresh of one row after the other in sequence, where tSTGR is less than tRC. The stagger time between refreshes of the rows reduces the instantaneous power draw and spreads the power draw over a longer period of time.

As illustrated, each row refresh completes after tRC. Thus, tRFC can be said to be (N−1) times tSTGR plus tRC, or the sum of all the stagger timings leading up to the refresh of Row[N−1], plus the tRC to complete the refresh of Row[N−1]. Once all N rows of the group have been refreshed, the refresh operation is complete.

In one embodiment, tREFI is a refresh interval timing, or a time between one external refresh command to the next. It will be understood that tREFI is the nominal timing between external refresh commands. Due to timing issues, there may be instances of a memory controller issuing multiple refresh commands in closer succession, such as making up refresh if a refresh has been delayed, for example. The illustration of diagram 300 can represent an expected case. Thus, in one embodiment, the memory controller issues a second refresh command REF2 a time tREFI after issuing REF1. The operations of transaction 324 proceed similar to those of transaction 322. In response to REF2, the memory device commences refresh of Row[N], which is the next row that would be indicated by refresh address information, assuming no other refreshes occurred between issuance of REF1 and REF2.

In transaction 324, instead of completing refresh of N more rows, in one embodiment, the memory controller issues a refresh abort during the refresh. The command ACT1 represents a refresh abort. In one embodiment, when the memory controller issues an activate command during an active refresh and when the memory device is enable for refresh abort, the memory device treats receipt of the activate command as a refresh abort. In one embodiment, a different command can be used as a refresh abort. In response to the abort command, the memory device terminates the refresh without refresh all N rows.

The refresh abort from the memory controller reduces the time in refresh from tRFC to tRFC_abort. In one embodiment, tRFC_abort can be as low as tRC (which can be approximately 40-50 ns), depending on when the command to abort refresh is issued. The window for the memory controller to issue a refresh abort is from 0 to (tRFC-tRC). The timing for abort can be optimized for different systems based on internal refresh staggering implementations for different memory devices. In one embodiment, if the memory device receives a refresh abort (e.g., an external ACT) to a bank being refreshed in the window of tSTGR, it will not generate or it will not execute an internal operation to start the refresh for the subsequent row. In response to the refresh abort, the memory device will exit refresh, and the exit time will be tRFC_abort. The time of tRFC_abort will depend on when the abort command is received, but will generally be equal to tRC plus a number (Z−1) of tSTGR times, where Z is the number of rows refreshed prior to the abort. The time may additionally include a guard band of a few nanoseconds (e.g., 2-3 ns).

In one embodiment, a memory device staggers refreshes across banks and bank groups. In one embodiment, refresh cannot be aborted in the last tRC of the tRFC window. If refresh abort command is issued during tRFC other than in the last tRC of the tRFC window, all remaining row refreshes are not started. In one embodiment, if the tSTGR window has passed when an abort command is received, the memory device will wait until the next row to abort the refresh. If the last row has already been reached of the ongoing refresh, the refresh will not be aborted and the memory controller will have to wait for the expiration of tRFC prior to issuing an access command.

In one embodiment, after refresh abort, the memory controller issues another activate command, which is identified as ACT2, where the second activate command opens a page for access. In one embodiment, after a refresh abort, the memory controller subsequent to an access will issue another refresh command, and the memory device will execute refresh of the same N rows targeted by the command REF2. In one embodiment, after abort of a refresh, the memory controller will determine to not issue a subsequent refresh command. For example, the memory controller may determine that subsequent access to the memory locations makes the refresh unnecessary. In such an implementation, the system can include a mechanism to enable the memory device to refresh the correct rows in response to a subsequent refresh command, even if the memory device does not increment an internal refresh counter.

In one embodiment, the memory controller aborts the refresh, but the memory device keeps track of the row address counter to identify a next row to refresh, which would identify the row that would have been refreshed if refresh had not been aborted. In one embodiment, the memory controller issues a subsequent refresh command, and the memory device initiates refresh at the row after the one completed before the abort. In one embodiment, the memory controller can "complete" the refresh by issuing a refresh, and allowing the memory device enough time to complete the rest of the rows, and then issue another abort.

FIG. 4 is a block diagram of an embodiment of a mode register that enables refresh abort in a memory device. Mode register 400 represents an embodiment of a mode register in a memory device or DRAM device in a system that support external refresh abort. Thus, mode register 400 can represent a mode register for a memory device in accordance with system 100 of FIG. 1 or system 200 of FIG. 2. In one embodiment, mode register 400 provides an example of how a mode register set (MRS) command can set a mode register configuration to enable external refresh abort. Configuration setting 402 represents one or more bits (at address Ay of mode register MRx, where x and y are integers) to enable the refresh abort operating mode. In one embodiment, setting 402 is a single bit, where a 0 disables refresh abort and a 1 enables the refresh abort. In one embodiment, setting the mode configuration enables the memory device to abort an ongoing refresh in response to receipt of a refresh abort command. In one embodiment, the memory device exits refresh after refresh of a row currently being refreshed.

FIG. 5 is a block diagram of an embodiment of command encoding for a refresh abort command. Command encoding 500 represents one embodiment of command encoding or a command table that defines selected commands a memory controller can issue to a memory device. Command encoding 500 can represent an example of command encoding by a memory controller to a memory device in accordance with system 100 of FIG. 1 or system 200 of FIG. 2.

Command 502 represents a refresh command (REF), which can be an all bank refresh command. An all bank refresh triggers a refresh of a group of rows to refresh in all banks of a memory device. In contrast, command 504 represents a per bank refresh command (REFpb). A per bank refresh triggers refresh of a group of rows in a specified or selected bank. In on embodiment, in both cases the group of rows can be identified by an internal refresh counter. In one embodiment, both REF and REFpb are enabled by a clock enable (CKE) signal. In one embodiment, the bank group (BG), bank address (BA), and row address (ADDR) signals are "don't care" for REF. In one embodiment, the ADDR signals are "don't care," but either or both of BG and BA are specified for REFpb.

In one embodiment, an activate command provides a refresh abort of an active refresh, if refresh abort is enabled. Command 506 represents a traditional activate command (ACT). Such a command is enabled with a CKE signal, and BG, BA, and ADDR signals are typically "don't care." In one embodiment, command encoding 500 includes command 508, which represents a refresh abort activate command (ACTpb). In one embodiment, ACTpb identifies either BG or BA or both to select a bank for refresh. In one embodiment, the ACTpb command can have a similar encoding to ACT, but one or more signal line of ACT command signaling can be different to identify a per bank versus a standard activate command. In one embodiment, command encoding 500 includes command 510, which can represent a dedicated refresh abort command in a case where ACT does not act as an active refresh abort. In one embodiment, such an abort command could have separate all bank and per bank versions, such as illustrated by options of whether or not BG or BA information is provided.

In one embodiment, the memory controller controls the issuance of commands, including the use of per bank or all bank commands. For example, consider a scenario where a memory subsystem supports both all bank and per bank refreshes, as well as all bank and per bank refresh aborts. In one embodiment, if the memory controller issues an all bank refresh (REF) command, it will issue an all bank abort (ACT) to abort the refresh. In one embodiment, the memory controller can issue one or more per bank aborts (ACTpb) to abort an all bank refresh, but it will be understood that management and implementation of timing will be very complicated. Thus, in certain implementations such a scenario could be technically possible but disallowed by convention to avoid the complexities involved. In one embodiment, if the memory controller issues a per bank refresh (REFpb), it will abort the refresh by issuing a per bank refresh (ACTpb) to the same bank or banks. In one embodiment, the memory controller issues REFpb commands to multiple different selected banks, and aborts all per bank refreshes by issuing an all bank refresh abort.

Figure 6A:
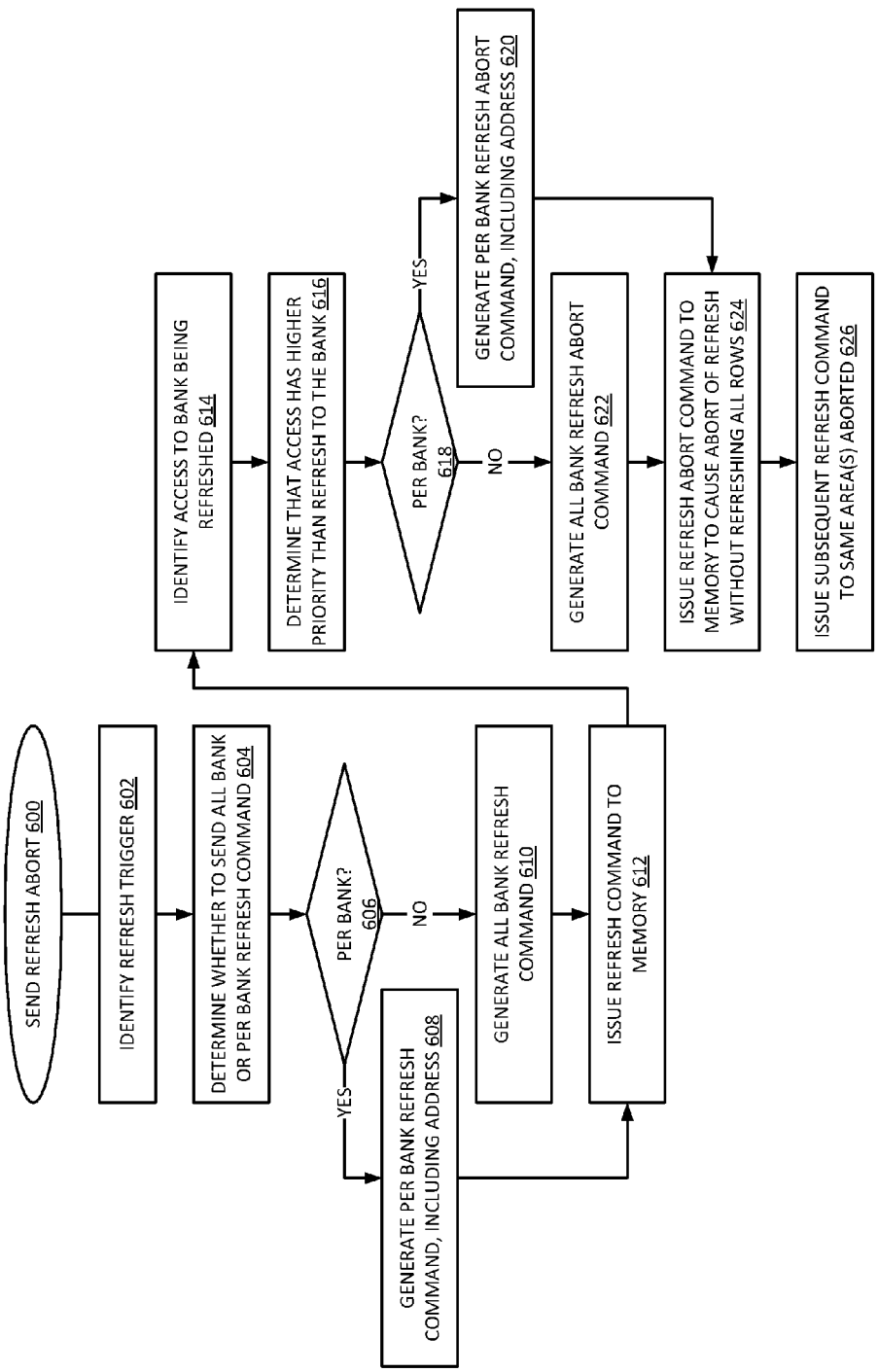
FIG. 6A is a flow diagram of an embodiment of a process for generating a refresh abort of an active refresh.

FIG. 6A is a flow diagram of an embodiment of a process for generating a refresh abort of an active refresh. Process 600 for sending a refresh abort represents one embodiment of a process to be executed by a memory controller. Such a process can be executed by a memory controller in accordance with any embodiment described herein. In one embodiment, the memory controller enables one or more memory devices for refresh abort during initialization of the memory devices. For example, the memory controller can generate an MRS command to set one or more configuration bits to enable refresh abort.

In one embodiment, a memory controller identifies a refresh trigger, 602. Such a refresh trigger can be a timer or a counter indication that a certain amount of time has elapsed (e.g., tREFI) and another refresh needs to be issued. In one embodiment, the memory controller determines whether to issue an all bank or per bank refresh command, 604. The scheduler of a memory controller can determine to send a per bank refresh, for example, when there is heavier access for a period and there is still time to refresh rows in banks not selected for refresh. If the refresh is a per bank refresh, 606 YES branch, the memory controller can generate a per bank refresh command, including address information, 608. If the refresh is an all bank refresh, 606 NO branch, the memory controller generates the all bank refresh command, which does not include address information, 610. With either a per bank or an all bank refresh, the memory controller issues the refresh command to one or more memory devices, 612.

In one embodiment, the memory controller schedules the refresh command in a queue, and there is a delay between generation of the command and issuance of the command. In one embodiment, the memory controller identifies access to a bank being refreshed, 614. The bank being refreshed can refer to a bank for which a refresh command has been generated and scheduled, which may or may not have been sent over the signal lines to the memory device(s). In one embodiment, the memory controller determines that the access to the bank or banks being refreshed has a higher priority than refresh to the bank, 616. Access may be higher priority than refresh depending on the amount of access to the memory, the access to specific banks, or other considerations.

If the memory access is determined to be higher priority than the refresh operation, the memory controller can issue a refresh abort in accordance with an embodiment described herein. In one embodiment, if the refresh to be aborted is a per bank refresh, 618 YES branch, the memory controller generates a per bank refresh abort command, which includes address information, 620. In one embodiment, if the refresh to be aborted is an all bank refresh, the memory controller generates an all bank refresh abort command, 622. In one embodiment, even if the refresh to be aborted is a per bank refresh, the memory controller can issue an all bank refresh command.

The memory controller can issue the refresh abort command to the memory to cause abort of the refresh, 624. Refresh abort will cause the memory to exit the refresh without refreshing all rows of a group that would otherwise be refreshed in response to the external refresh command. The refresh can be aborted if the abort command is issued during the memory device refresh cycle. In one embodiment, after the abort exit timing is complete, the memory controller sends an activate command after the refresh abort to open a page of memory. In one embodiment, the memory controller issues a subsequent refresh command for the same rows for which the refresh was aborted, 626.

Figure 6B:
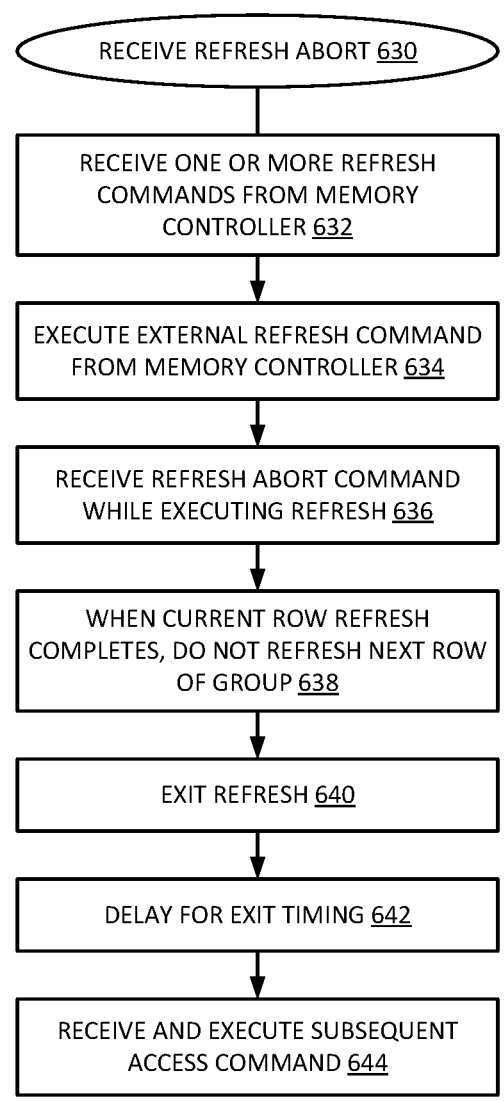
FIG. 6B is a flow diagram of an embodiment of a process for receiving a refresh abort of an active refresh.

FIG. 6B is a flow diagram of an embodiment of a process for receiving a refresh abort of an active refresh. Process 630 for receiving a refresh abort represents one embodiment of a process to be executed by a memory device. Such a process can be executed by a memory device in accordance with any embodiment described herein. In one embodiment, the memory controller enables one or more memory devices for refresh abort during initialization of the memory devices. For example, the memory controller can generate an MRS command to set one or more configuration bits to enable refresh abort. In one embodiment, only a memory device configured for refresh abort can be aborted during refresh.

In one embodiment, the memory device receives one or more refresh commands from an associated memory controller, 632. The memory device executes the external refresh command from the memory controller by generating and executing various internal operations, 634. While executing the refresh, the memory device receives a refresh abort command from the memory controller, 636. In one embodiment, the memory device completes a refresh of a row currently being refreshed, and then does not refresh a subsequent row in the group, 638. Thus, the memory device exits refresh instead of continuing with the refresh. In one embodiment, an internal controller within the memory device does not generate internal operations for the rows of the group that have not been refreshed.

The memory device exits from refresh, 640 and may delay for the completion of an exit timing, 642. The exit timing can refer to a guard band time for the memory device to prepare for access. The memory device can then receive and execute a subsequent access command after exiting refresh, 644. In one embodiment, the memory device does not increment an internal refresh address counter for aborted refreshes. In one embodiment, the memory device will receive a subsequent refresh from the memory controller, and will refresh the same rows.

Figure 7:
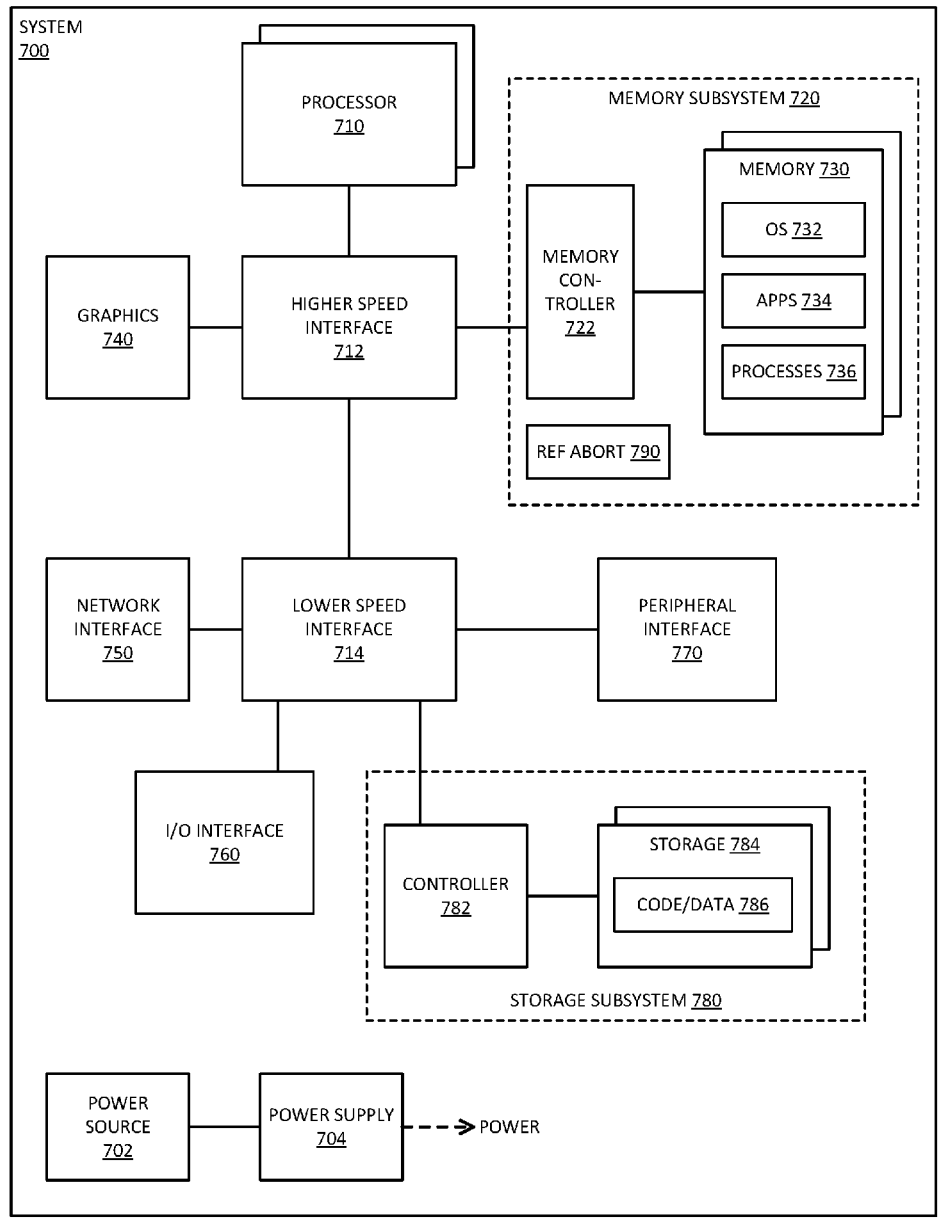
FIG. 7 is a block diagram of an embodiment of a computing system in which abort of memory controller controlled refresh can be implemented.

FIG. 7 is a block diagram of an embodiment of a computing system in which abort of memory controller controlled refresh can be implemented. System 700 represents a computing device in accordance with any embodiment described herein, and can be a laptop computer, a desktop computer, a server, a gaming or entertainment control system, a scanner, copier, printer, routing or switching device, embedded computing device, or other electronic device.

System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 700 includes interface 712 coupled to processor 710, which can represent a higher speed interface or a high throughput interface for system components that needs higher bandwidth connections, such as memory subsystem 720 or graphics interface components 740. Interface 712 can represent a "north bridge" circuit, which can be a standalone component or integrated onto a processor die. Graphics interface 740 interfaces to graphics components for providing a visual display to a user of system 700. In one embodiment, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more memory devices 730 such as read-only memory (ROM), flash memory, one or more varieties of random access memory (RAM), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processor 736 represent agents or routines that provide auxiliary functions to OS 732 or one or more applications 734 or a combination. OS 732, applications 734, and processes 736 provide logic to provide functions for system 700. In one embodiment, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 700 includes interface 714, which can be coupled to interface 712. Interface 714 can be a lower speed interface than interface 712. In one embodiment, interface 714 can be a "south bridge" circuit, which can include standalone components and integrated circuitry. In one embodiment, multiple user interface components or peripheral components, or both, couple to interface 714. Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces. Network interface 750 can exchange data with a remote device, which can include sending data stored in memory or receiving data to be stored in memory.

In one embodiment, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one embodiment, system 700 includes storage subsystem 780 to store data in a nonvolatile manner. In one embodiment, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one embodiment, storage subsystem 780 includes controller 782 to interface with storage 784. In one embodiment controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 702 to provide power to the components of system 700. In one embodiment, power supply 704 includes an AC to DC (alternating current to direct current) adapter to plug into a wall outlet. Such AC power can be renewable energy (e.g., solar power) power source 702. In one embodiment, power source 702 includes a DC power source, such as an external AC to DC converter. In one embodiment, power source 702 or power supply 704 includes wireless charging hardware to charge via proximity to a charging field. In one embodiment, power source 702 can include an internal battery or fuel cell source.

System 700 illustrates refresh abort 790 in memory subsystem 720, which represents functionality to provide refresh abort in accordance with any embodiment described herein. In one embodiment, refresh abort 790 represents functionality of components of memory subsystem 720. In one embodiment, refresh abort 790 includes additional circuitry or logic or both to provide the refresh abort functionality. After memory controller 722 issues an external, active refresh command to a volatile memory component of memory 730, the memory controller can issue a refresh abort command to cause the memory to exit refresh without completing the refresh. The refresh includes multiple internal operations to refresh multiple rows of memory.

Figure 8:
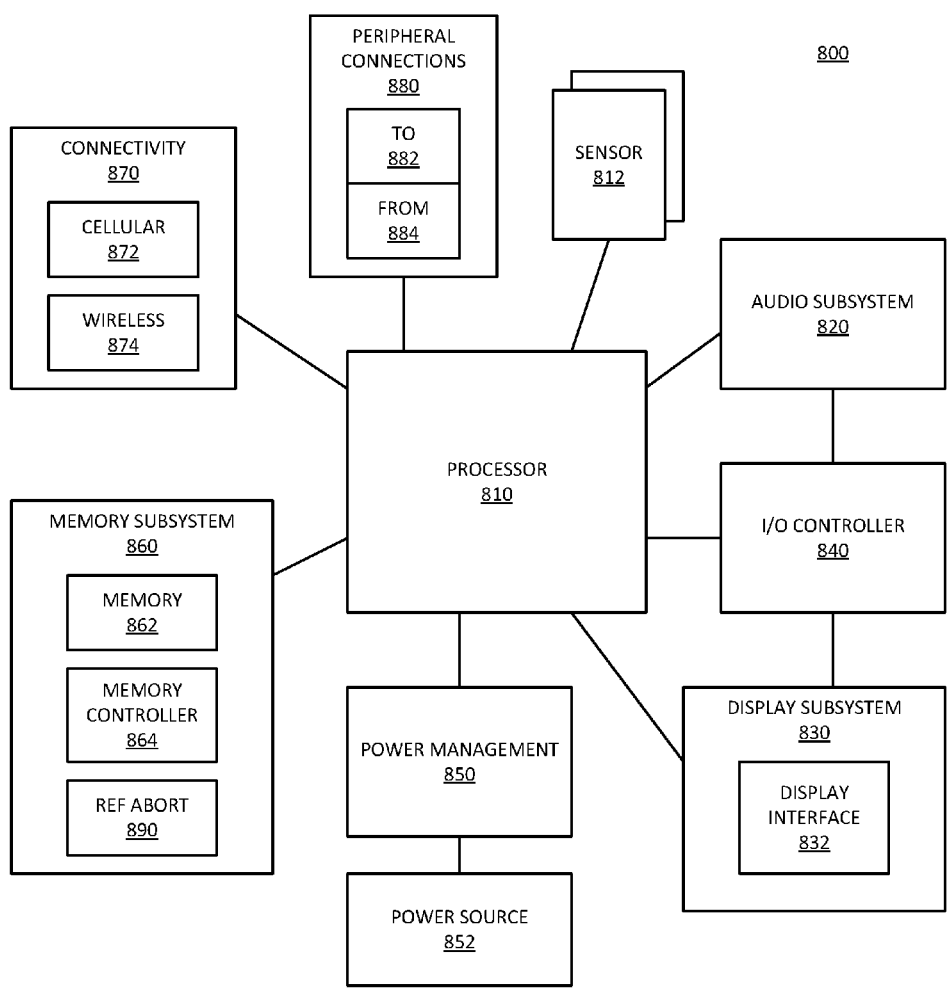
FIG. 8 is a block diagram of an embodiment of a mobile device in which abort of memory controller controlled refresh can be implemented.

FIG. 8 is a block diagram of an embodiment of a mobile device in which abort of memory controller controlled refresh can be implemented. Device 800 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting device 800 to another device, or a combination. The processing operations can also include operations related to audio I/O, display I/O, or other interfacing, or a combination. Processor 810 can execute data stored in memory. Processor 810 can write or edit data stored in memory.

In one embodiment, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature, motion, light detection, or other sensors, or a combination. Sensors 812 should be understood broadly, and not limiting on the many different types of sensors that could be implemented with system 800. In one embodiment, one or more sensors 812 couples to processor 810 via a frontend circuit integrated with processor 810. In one embodiment, one or more sensors 812 couples to processor 810 via another component of system 800.

In one embodiment, device 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software components (e.g., drivers) that provide a visual display for presentation to a user. In one embodiment, the display includes tactile components or touchscreen elements for a user to interact with the computing device. Display subsystem 830 includes display interface 832, which includes the particular screen or hardware device used to provide a display to a user. In one embodiment, display interface 832 includes logic separate from processor 810 (such as a graphics processor) to perform at least some processing related to the display. In one embodiment, display subsystem 830 includes a touchscreen device that provides both output and input to a user. In one embodiment, display subsystem 830 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 830 generates display information based on data stored in memory and operations executed by processor 810.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Power management 850 manages power from power source 852, which provides power to the components of system 800. In one embodiment, power source 852 includes an AC to DC (alternating current to direct current) adapter to plug into a wall outlet. Such AC power can be renewable energy (e.g., solar power, motion based power). In one embodiment, power source 852 includes only DC power, which can be provided by a DC power source, such as an external AC to DC converter. In one embodiment, power source 852 includes wireless charging hardware to charge via proximity to a charging field. In one embodiment, power source 852 can include an internal battery or fuel cell source.

Memory subsystem 860 includes memory device(s) 862 for storing information in device 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to memory device 862.

Connectivity 870 includes hardware devices (e.g., wireless or wired connectors and communication hardware, or a combination of wired and wireless hardware) and software components (e.g., drivers, protocol stacks) to enable device 800 to communicate with external devices. The external device could be separate devices, such as other computing devices, wireless access points or base stations, as well as peripherals such as headsets, printers, or other devices. In one embodiment, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading, uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

System 800 illustrates refresh abort 890 in memory subsystem 860, which represents functionality to provide refresh abort in accordance with any embodiment described herein. In one embodiment, refresh abort 890 represents functionality of components of memory subsystem 860. In one embodiment, refresh abort 890 includes additional circuitry or logic or both to provide the refresh abort functionality. After memory controller 864 issues an external, active refresh command to a volatile memory component of memory 862, the memory controller can issue a refresh abort command to cause the memory to exit refresh without completing the refresh. The refresh includes multiple internal operations to refresh multiple rows of memory.

In one aspect, a method for managing memory refresh includes: issuing a refresh command from a memory controller to a memory device for refresh of the memory device during active operation of the memory device, wherein the refresh command to cause refresh of a group of N rows with refresh timing controlled by the memory controller, wherein completion of the refresh includes refresh of all N rows; and issuing a refresh abort to the memory device during the refresh, to cause the memory device to exit the refresh prior to completion of the refresh.

In one embodiment, N equals 8 or 16. In one embodiment, issuing the abort command comprises issuing a per bank abort command. In one embodiment, issuing the abort command comprises issuing an all bank abort command. In one embodiment, issuing the refresh command comprises issuing a per bank refresh command and wherein issuing the abort command comprises issuing an all bank abort command. In one embodiment, issuing the abort command comprises issuing an Activate command. In one embodiment, issuing the abort command comprises specifying an address for the abort command. In one embodiment, issuing a mode register set (MRS) command prior to issuance of the refresh command, the MRS command to enable the memory device for refresh abort. In one embodiment, issuing a subsequent refresh command after issuance of the refresh abort command, the subsequent refresh command to cause refresh of the same N rows. further comprising failing to issue a subsequent refresh command to cause refresh of the same N rows after issuance of the refresh abort command. In one embodiment, in response to issuance of the refresh abort command, the memory device not incrementing an internal refresh counter. In one embodiment, further comprising: identifying a scheduled memory access to the N rows; and determining that access to a bank including the N rows has priority over refresh of the N rows; and wherein issuing the refresh abort is to cancel refresh of the N rows to permit access to the bank. In one embodiment, determining that the access to the bank has priority over refresh comprises determining that the access to the bank obviates a need to refresh the N rows, and comprising failing to subsequently refresh the N rows based on the determination. In one embodiment, further comprising the memory device staggering a start of refresh of the N rows, wherein initiation of refresh of the N rows occurs one row at a time in sequence of increasing address. In one embodiment, the memory device comprises a dynamic random access memory (DRAM) device compatible with a double data rate (DDR) standard. In one embodiment, the memory device comprises a DDR5 (double data rate version 5) SDRAM (synchronous dynamic random access memory) device.

In one aspect, an article of manufacture comprising a computer readable storage medium having content stored thereon to cause execution of operations to execute a method for managing memory refresh in accordance with any embodiment of the above method. In one aspect, an apparatus comprising means for performing operations to execute a method for managing memory refresh in accordance with any embodiment of the above method.

In one aspect, a memory controller for managing memory refresh includes: input/output (I/O) circuitry to couple to a memory device; and command logic to issue a refresh command to a memory device for refresh of the memory device during active operation of the memory device, wherein issuance of the refresh command is to cause refresh of a group of N rows of the memory device, with refresh timing controlled by the memory controller, wherein completion of the refresh includes refresh of all N rows, and wherein N is greater than one; and issue a refresh abort to the memory device during the refresh, to cause the memory device to exit the refresh prior to completion of the refresh.

In one embodiment, N equals 8 or 16. In one embodiment, the command logic to issue the abort command comprises issuance of a per bank abort command. In one embodiment, the command logic to issue the abort command comprises issuance of an all bank abort command. In one embodiment, the refresh command comprises a per bank refresh command and the abort command comprises an all bank abort command. In one embodiment, the command logic to issue the abort command comprises the command logic to issue an Activate command. In one embodiment, the command logic to issue the abort command comprises the command logic to specify an address for the abort command. In one embodiment, the command logic to issue a mode register set (MRS) command prior to issuance of the refresh command, the MRS command to enable the memory device for refresh abort. In one embodiment, the command logic to issue a subsequent refresh command after issuance of the refresh abort command, the subsequent refresh command to cause refresh of the same N rows. In one embodiment, the command logic to fail to issue a subsequent refresh command to cause refresh of the same N rows after issuance of the refresh abort command. In one embodiment, in response to issuance of the refresh abort command, the memory device is to not increment an internal refresh counter. In one embodiment, further comprising: a scheduler communicatively coupled to the command logic. In one embodiment, the scheduler is to identify a scheduled memory access to the N rows; and determine that access to a bank including the N rows has priority over refresh of the N rows; and wherein the command logic is to issue the refresh abort to cancel refresh of the N rows to permit access to the bank. In one embodiment, the scheduler is to determine that the access to the bank is to obviate a need to refresh the N rows, and wherein the command logic is to fail to subsequently refresh the N rows based on the determination. In one embodiment, the memory device is to stagger a start of refresh of the N rows, wherein initiation of refresh of the N rows occurs one row at a time in sequence of increasing address. In one embodiment, the memory device comprises a dynamic random access memory (DRAM) device compatible with a double data rate (DDR) standard. In one embodiment, the memory device comprises a DDR5 (double data rate version 5) SDRAM (synchronous dynamic random access memory) device.

In one aspect a system with a memory subsystem includes: multiple dynamic random access memory (DRAM) devices; and a memory controller coupled to the DRAM devices, the memory controller including command logic to issue a refresh command to a memory device for refresh of the memory device during active operation of the memory device, wherein issuance of the refresh command is to cause refresh of a group of N rows of the memory device, with refresh timing controlled by the memory controller, wherein completion of the refresh includes refresh of all N rows, and wherein N is greater than one; and issue a refresh abort to the memory device during the refresh, to cause the memory device to exit the refresh prior to completion of the refresh. The system can include a memory controller in accordance with any embodiment of the above memory controller. In one embodiment, further comprising one or more of: at least one processor communicatively coupled to the memory controller; a display communicatively coupled to at least one processor; a battery to power the system; or a network interface communicatively coupled to at least one processor; or a combination.

In one aspect, a method for memory device refresh includes: receiving a refresh command for refresh of the memory device during active operation of the memory device; in response to receiving the refresh command, initiating refresh of a group of N rows, with refresh timing controlled by the memory controller, wherein completion of the refresh includes refresh of all N rows, and wherein N is greater than one; receiving a refresh abort during the refresh; and in response to receiving the refresh abort, exiting the refresh prior to completion of the refresh in response to the refresh abort.

In one embodiment, N equals 8 or 16. In one embodiment, receiving the refresh abort comprises receiving a per bank abort command. In one embodiment, receiving the refresh abort comprises receiving an all bank abort command. In one embodiment, the refresh command comprises a per bank refresh command and the refresh abort comprises an all bank abort command. In one embodiment, receiving the refresh abort comprises receiving an Activate command. In one embodiment, receiving the refresh abort comprises receiving an abort command including an address for the abort command. In one embodiment, further comprising receiving a mode register set (MRS) command prior to receipt of the refresh command, the MRS command to enable the memory device for refresh abort. In one embodiment, further comprising receiving a subsequent refresh command after receipt of the refresh abort, and in response to the subsequent refresh command, the refresh logic to refresh of the same N rows. In one embodiment, in response to receiving the refresh abort, the refresh not incrementing an internal refresh counter. In one embodiment, further comprising staggering initiation of refresh of the N rows, wherein initiation of refresh of the N rows occurs one row at a time in sequence of increasing address. In one embodiment, the memory device comprises a dynamic random access memory (DRAM) device compatible with a double data rate (DDR) standard. In one embodiment, the memory device comprises a DDR5 (double data rate version 5) SDRAM (synchronous dynamic random access memory) device.

In one aspect, an article of manufacture comprising a computer readable storage medium having content stored thereon to cause execution of operations to execute a method for managing memory refresh in accordance with any embodiment of the above method. In one aspect, an apparatus comprising means for performing operations to execute a method for managing memory refresh in accordance with any embodiment of the above method.

In one aspect, a memory device includes: input/output (I/O) circuitry to couple to a memory controller, and to receive a refresh command for refresh of the memory device during active operation of the memory device, and to receive a refresh abort during the refresh; and refresh logic to initiate refresh of a group of N rows in response to the refresh command, with refresh timing controlled by the memory controller, wherein completion of the refresh includes refresh of all N rows, and wherein N is greater than one, and to exit the refresh prior to completion of the refresh in response to the refresh abort.

In one embodiment, N equals 8 or 16. In one embodiment, the I/O logic to receive the abort command comprises receipt of a per bank abort command. In one embodiment, the I/O logic to receive the abort command comprises receipt of an all bank abort command. In one embodiment, the refresh command comprises a per bank refresh command and the abort command comprises an all bank abort command. In one embodiment, the I/O logic to receive the abort command comprises the I/O logic to receive an Activate command. In one embodiment, the I/O logic to receive the abort command comprises the I/O logic to receive an abort command including an address for the abort command. In one embodiment, the I/O logic to receive a mode register set (MRS) command prior to receipt of the refresh command, the MRS command to enable the memory device for refresh abort. In one embodiment, the I/O logic to receive a subsequent refresh command after receipt of the refresh abort command, and in response to the subsequent refresh command, the refresh logic to refresh of the same N rows. In one embodiment, in response to receipt of the refresh abort command, the refresh logic is to not increment an internal refresh counter. In one embodiment, the refresh logic is to stagger initiation of refresh of the N rows, wherein initiation of refresh of the N rows occurs one row at a time in sequence of increasing address. In one embodiment, the memory device comprises a dynamic random access memory (DRAM) device compatible with a double data rate (DDR) standard. In one embodiment, the memory device comprises a DDR5 (double data rate version 5) SDRAM (synchronous dynamic random access memory) device.

In one aspect, a system with a memory subsystem, comprising: a memory controller; a dynamic random access memory (DRAM) device, the DRAM device including input/output (I/O) circuitry to couple to a memory controller, and to receive a refresh command for refresh of the memory device during active operation of the memory device, and to receive a refresh abort during the refresh; and refresh logic to initiate refresh of a group of N rows in response to the refresh command, with refresh timing controlled by the memory controller, wherein completion of the refresh includes refresh of all N rows, and wherein N is greater than one, and to exit the refresh prior to completion of the refresh in response to the refresh abort. The system can include a DRAM device in accordance with any embodiment of the above memory device. In one embodiment, further comprising one or more of: at least one processor communicatively coupled to the memory controller; a display communicatively coupled to at least one processor; a battery to power the system; or a network interface communicatively coupled to at least one processor; or a combination.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller, comprising:
    input/output (I/O) circuitry to couple to a memory device; and
    command logic to
        issue a refresh command that is not a self-refresh command to a memory device for refresh of the memory device during active operation of the memory device, wherein issuance of the refresh command is to cause refresh of a group of N rows of the memory device, with refresh timing controlled by the memory controller and access timing being deterministic to the memory controller, wherein completion of the refresh includes refresh of all N rows, and wherein N is greater than one; and
        issue a refresh abort to the memory device during the refresh, to cause the memory device to exit the refresh prior to completion of the refresh.

2. The memory controller of claim 1, wherein N equals 8 or 16.

3. The memory controller of claim 1, wherein the command logic to issue the refresh abort comprises issuance of a per bank abort command.

4. The memory controller of claim 1, wherein the command logic to issue the refresh abort comprises issuance of an all bank abort command.

5. The memory controller of claim 4, wherein the refresh command comprises a per bank refresh command and the refresh abort comprises an all bank abort command.

6. The memory controller of claim 1, wherein the command logic to issue the refresh abort comprises the command logic to issue an Activate command.

7. The memory controller of claim 6, wherein the command logic to issue the refresh abort comprises the command logic to specify an address for the refresh abort.

8. The memory controller of claim 1, comprising the command logic to issue a mode register set (MRS) command prior to issuance of the refresh command, the MRS command to enable the memory device for refresh abort.

9. The memory controller of claim 1, comprising the command logic to issue a subsequent refresh command after issuance of the refresh abort, the subsequent refresh command to cause refresh of the same N rows.

10. The memory controller of claim 1, comprising the command logic to fail to issue a subsequent refresh command to cause refresh of the same N rows after issuance of the refresh abort.

11. The memory controller of claim 1, wherein, in response to issuance of the refresh abort, the memory device is to not increment an internal refresh counter.

12. The memory controller of claim 1, further comprising:
    a scheduler communicatively coupled to the command logic.

13. The memory controller of claim 12, wherein the scheduler is to
    identify a scheduled memory access to the N rows; and determine that access to a bank including the N rows has priority over refresh of the N rows; and wherein the command logic is to issue the refresh abort to cancel refresh of the N rows to permit access to the bank.

14. The memory controller of claim 13, wherein the scheduler is to determine that the access to the bank is to obviate a need to refresh the N rows, and wherein the command logic is to fail to subsequently refresh the N rows based on the determination.

15. The memory controller of claim 1, wherein the memory device is to stagger a start of refresh of the N rows, wherein initiation of refresh of the N rows occurs one row at a time in sequence of increasing address.

16. The memory controller of claim 1, wherein the memory device comprises a dynamic random access memory (DRAM) device compatible with a double data rate (DDR) standard.

17. The memory controller of claim 16, wherein the memory device comprises a DDR5 (double data rate version 5) SDRAM (synchronous dynamic random access memory) device.

18. A system with a memory subsystem, comprising:
multiple dynamic random access memory (DRAM) devices; and
a memory controller coupled to the DRAM devices, the memory controller including command logic to
issue a refresh command that is not a self-refresh command to a memory device for refresh of the memory device during active operation of the memory device, wherein issuance of the refresh command is to cause refresh of a group of N rows of the memory device, with refresh timing controlled by the memory controller and access timing being deterministic to the memory controller, wherein completion of the refresh includes refresh of all N rows, and wherein N is greater than one; and
issue a refresh abort to the memory device during the refresh, to cause the memory device to exit the refresh prior to completion of the refresh.

19. The system of claim 18, wherein the command logic to issue the refresh abort comprises issuance of a per bank abort command.

20. The system of claim 18, wherein the command logic to issue the refresh abort comprises issuance of an all bank abort command.

21. The system of claim 18, wherein the command logic to issue the refresh abort comprises the command logic to issue an Activate command.

22. The system of claim 18, comprising the command logic to issue a mode register set (MRS) command prior to issuance of the refresh command, the MRS command to enable the memory device for refresh abort.

23. The system of claim 18, the memory controller further comprising:
a scheduler communicatively coupled to the command logic, wherein the scheduler is to
identify a scheduled memory access to the N rows; and
determine that access to a bank including the N rows has priority over refresh of the N rows; and
wherein the command logic is to issue the refresh abort to cancel refresh of the N rows to permit access to the bank.

24. The system of claim 23, wherein the scheduler is to determine that the access to the bank is to obviate the need to refresh the N rows, and wherein the command logic is to fail to subsequently refresh the N rows based on the determination.

25. The system of claim 18, wherein the DRAM devices comprise double data rate version 5 (DDR5) SDRAM (synchronous dynamic random access memory) devices.

26. The system of claim 18, further comprising one or more of:
at least one processor communicatively coupled to the memory controller;
a display communicatively coupled to at least one processor;
a battery to power the system; or
a network interface communicatively coupled to at least one processor.

27. A method for managing memory refresh, comprising:
issuing a refresh command that is not a self-refresh command from a memory controller to a memory device for refresh of the memory device during active operation of the memory device, wherein the refresh command to cause refresh of a group of N rows with refresh timing controlled by the memory controller and access timing being deterministic to the memory controller, wherein completion of the refresh includes refresh of all N rows; and
issuing a refresh abort to the memory device during the refresh, to cause the memory device to exit the refresh prior to completion of the refresh.

28. The method of claim 27, wherein issuing the refresh abort comprises issuing either a per bank abort command or an all bank abort command.

29. The method of claim 27, further comprising:
identifying a scheduled memory access to the N rows; and
determining that access to a bank including the N rows has priority over refresh of the N rows; and
wherein issuing the refresh abort is to cancel refresh of the N rows to permit access to the bank.

* * * * *